US008486591B2

(12) United States Patent
Jeong et al.

(10) Patent No.: US 8,486,591 B2
(45) Date of Patent: Jul. 16, 2013

(54) PHOTOSENSITIVE RESIN COMPOSITION FOR COLOR FILTER AND COLOR FILTER PREPARED USING THE SAME

(75) Inventors: Eui-June Jeong, Uiwang-si (KR); Kil-Sung Lee, Uiwang-si (KR); Jae-Hyun Kim, Uiwang-si (KR); Chang-Min Lee, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 614 days.

(21) Appl. No.: 12/582,005

(22) Filed: Oct. 20, 2009

(65) Prior Publication Data

US 2010/0104958 A1    Apr. 29, 2010

(30) Foreign Application Priority Data

Oct. 24, 2008   (KR) .................. 10-2008-0104869
Dec. 3, 2008    (KR) .................. 10-2008-0122097

(51) Int. Cl.
*G02B 5/20* (2006.01)

(52) U.S. Cl.
USPC .................... 430/7; 430/270.1; 430/281.1

(58) Field of Classification Search
None
See application file for complete search history.

(56) References Cited

U.S. PATENT DOCUMENTS

| 5,278,009 A | 1/1994 | Iida et al. |
| 5,663,019 A | 9/1997 | Matsumura et al. |
| 5,998,091 A | 12/1999 | Suzuki |
| 6,187,506 B1 | 2/2001 | Ding et al. |
| 6,589,672 B1 | 7/2003 | Kobayashi et al. |
| 6,620,858 B2 | 9/2003 | Cyr et al. |
| 6,826,001 B2 | 11/2004 | Funakura et al. |
| 7,591,888 B2 | 9/2009 | Fujii et al. |
| 8,153,706 B2 * | 4/2012 | Vasudevan .................. 523/160 |
| 2002/0045112 A1 | 4/2002 | Kishimoto et al. |
| 2002/0172873 A1 | 11/2002 | Ueda et al. |
| 2004/0157140 A1 | 8/2004 | Kamata et al. |
| 2006/0051685 A1 | 3/2006 | Fujimori et al. |
| 2006/0089422 A1 | 4/2006 | Vasudevan |
| 2006/0100298 A1 | 5/2006 | Ulrich et al. |
| 2006/0257762 A1 | 11/2006 | Fujimori et al. |
| 2006/0275676 A1 | 12/2006 | Yamada |
| 2008/0160432 A1 | 7/2008 | Byon et al. |

(Continued)

FOREIGN PATENT DOCUMENTS

| CN | 1188908 A | 7/1998 |
| CN | 1196030 C | 9/2002 |

(Continued)

OTHER PUBLICATIONS

Korean Office Action in commonly owned Korean Patent Application No. 10-2006-0136211, dated Jun. 18, 2009, pp. 1-4.

(Continued)

*Primary Examiner* — John A. McPherson
(74) *Attorney, Agent, or Firm* — Summa, Additon & Ashe, P.A.

(57) ABSTRACT

Disclosed is a color filter photosensitive resin composition that includes (A) an acryl-based binder resin having at least one carboxyl group, (B) an acryl-based photopolymerizable monomer, (C) a photopolymerization initiator, and (D) a solvent, where at least one of the acryl-based binder resin or the acryl-based photopolymerizable monomer includes a blue dye functional group. The color filter photosensitive resin composition can be prepared into a color filter having uniformity, almost no residue, and high resolution due to ultrafine pixels of 1.4 μm or less.

12 Claims, 2 Drawing Sheets

U.S. PATENT DOCUMENTS

| | | | |
|---|---|---|---|
| 2008/0171271 A1* | 7/2008 | Kim et al. | 430/7 |
| 2008/0286688 A1 | 11/2008 | Koyanagi et al. | |
| 2009/0029120 A1* | 1/2009 | Fujii et al. | 428/195.1 |

FOREIGN PATENT DOCUMENTS

| | | | |
|---|---|---|---|
| CN | 1460192 A | | 12/2003 |
| CN | 1782748 A | | 6/2006 |
| CN | 1834704 A | | 9/2006 |
| CN | 101024624 A | | 8/2007 |
| CN | 101122744 A | | 2/2008 |
| EP | 0337951 A2 | | 10/1989 |
| EP | 0628599 A1 | | 7/1994 |
| EP | 0725315 A2 | | 8/1996 |
| JP | 07-140654 | | 6/1995 |
| JP | 7-172032 | | 7/1995 |
| JP | 09-203806 | | 8/1997 |
| JP | 10-158538 A | | 6/1998 |
| JP | 10-254133 | | 9/1998 |
| JP | 2000-309726 | | 11/2000 |
| JP | 2002-309118 | | 10/2002 |
| JP | 2003-003109 | | 1/2003 |
| JP | 2003-161828 A | | 6/2003 |
| JP | 2003-167113 A | | 6/2003 |
| JP | 2004-020897 A | | 1/2004 |
| JP | 2004-506064 A | | 2/2004 |
| JP | 2004-341121 | | 12/2004 |
| JP | 2008-039952 A | | 2/2008 |
| KR | 10-1991-0004717 B1 | | 7/1991 |
| KR | 10-1992-7002502 | | 9/1992 |
| KR | 10-1993-7000858 | | 3/1993 |
| KR | 10-1994-0005617 B1 | | 6/1994 |
| KR | 10-1994-0007778 | | 8/1994 |
| KR | 10-1995-7000359 | | 1/1995 |
| KR | 10-1995-0011163 B1 | | 9/1995 |
| KR | 10-1995-7003746 | | 9/1995 |
| KR | 10-1996-0029904 | | 8/1996 |
| KR | 10-2004-0095670 A | | 11/2004 |
| KR | 10-2005-0069024 A | | 7/2005 |
| KR | 10-2005-0070619 A | | 7/2005 |
| KR | 2006-0052171 | | 5/2006 |
| KR | 10-2006-0077971 A | | 7/2006 |
| KR | 10-2006-0096882 A | | 9/2006 |
| KR | 10-2008-0036351 A | | 4/2008 |
| WO | 02/12403 A2 | | 2/2002 |
| WO | 2005/071489 A1 | | 8/2005 |
| WO | 2006/037728 A1 | | 4/2006 |
| WO | 2007/091631 A1 | | 8/2007 |

OTHER PUBLICATIONS

English translation of Korean Office Action in commonly owned Korean Patent Application No. 10-2006-0136211, dated Jun. 18, 2009, pp. 1-2.

Chinese Office Action in commonly owned Chinese Application No. 200710302350.3 dated Jul. 29, 2011, pp. 1-6.

English translation of Chinese Office Action in commonly owned Chinese Application No. 200710302350.3 dated Jul. 29, 2011, pp. 1-11.

Office Action in commonly owned U.S. Appl. No. 11/949,114 mailed Aug. 19, 2010, pp. 1-11.

Final Office Action in commonly owned U.S. Appl. No. 11/949,114 mailed Feb. 3, 2011, pp. 1-9.

Final Office Action in commonly owned U.S. Appl. No. 11/949,114 mailed May 16, 2011, pp. 1-9.

Advisory Action in commonly owned U.S. Appl. No. 11/949,114 mailed Aug. 22, 2011, pp. 1-3.

Office Action in commonly owned U.S. Appl. No. 11/965,134 mailed Sep. 20, 2011, pp. 1-10.

Final Office Action in commonly owned U.S. Appl. No. 11/965,134, mailed Jan. 3, 2012, pp. 1-10.

Office Action in commonly owned U.S. Appl. No. 11/965,134 mailed Apr. 6, 2012, pp. 1-9.

Taiwanese Search Report in counterpart Taiwanese Application No. 98135930 dated Jan. 14, 2013, pp. 1.

* cited by examiner

PHOTOSENSITIVE RESIN COMPOSITION FOR COLOR FILTER AND COLOR FILTER PREPARED USING THE SAME

CROSS-REFERENCE TO RELATED APPLICATIONS

This application claims priority to and the benefit of Korean Patent Application Nos. 10-2008-0104869 and 10-2008-0122097 filed in the Korean Intellectual Property Office on Oct. 24, 2008 and Dec. 3, 2008, respectively, the entire disclosure of each of which is incorporated herein by reference.

FIELD OF THE INVENTION

The present invention relates to a photosensitive resin composition for a color filter and a color filter prepared using the same.

BACKGROUND OF THE INVENTION

Color filters are used for liquid crystal displays (LCD), optical filters for cameras, and the like. Color filters may be fabricated by coating a fine region with a thin film colored with three or more colors on a charge coupled device or a transparent substrate.

This colored thin film can be fabricated using methods such as dyeing, printing, electrophoretic deposition (EPD), pigment dispersion, and the like.

The dyeing method forms a colored film by forming an image with a dyeing agent on a substrate, and then dyeing the image with direct dyes. Examples of the dyeing agent useful in the fabrication of colored thin films include natural photosensitive resins such as gelatin, amine-modified polyvinyl alcohols, amine-modified acryl-based resins, and the like. However, the dyeing process may be complex and lengthy, since it should include resist printing whenever a color needs to be changed to form a multicolored thin film on the same substrate.

In addition, many generally-used dyes and resins may have good color vividness and dispersion, but may also have poor color fastness, water resistance, and heat resistance, which are very important characteristics.

For example, Korean Patent Laid-Open Publication No. 1991-0004717 and No. 1994-0007778 include azo and azide compounds as a dye, which have deteriorated heat resistance and durability compared with a pigment.

The printing method forms a colored thin film by printing an ink prepared by dispersing a pigment into a thermally curable or photocurable resin and curing it with heat or light.

This method may decrease material costs compared with other methods, but it is difficult to form a fine and precise image and acquire a uniform thin film layer.

Korean Patent Laid-Open Publication No. 1995-7003746 discloses a method of making a color filter using an Inkjet method. However, the resultant color filter suffers similar problems to a color filter made using dyeing techniques, such as deteriorated durability and heat resistance, because a dye-type color resist composition is also used and dispersed from a nozzle to accomplish fine and precise color printing in this Inkjet printing method.

Korean Patent Laid-Open Publication No. 1993-7000858 and 1996-0029904 disclose electrophoretic deposition (EPD) in an electric precipitation method. The electrophoretic deposition (EPD) can form a precise color film having excellent heat resistance and color fastness, since it uses a pigment. However, this method may not be suitable for use for future highly precise color filters requiring a finer electrode pattern for a more precise pixel, because it may produce a colored film that is stained or thicker at both ends due to electrical resistance.

The pigment dispersion method forms a colored film by repeating a series of processes such as coating, exposing to light, developing, and curing a photopolymer composition including a coloring agent on a transparent substrate including a light-blocking layer (black matrix).

This method can improve heat resistance and durability, which are very important characteristics for a color filter, and can provide a uniform film thickness.

For example, Korean Patent Laid-Open Publications No. 1992-7002502, 1994-0005617, 1995-0011163, and 1995-7000359 disclose a method of making a color resist in a pigment dispersion method.

In this pigment dispersion method, a photosensitive resin composition for a color filter generally includes a binder resin, a photopolymerization monomer, a photopolymerization initiator, an epoxy resin, a solvent, and other additives.

For example, the binder resin can include a carboxyl-containing acryl-based copolymer, as in Japanese Patent Laid-Open Publications Pyung 7-140654 and 10-254133.

However, the above-described references do not yet provide a satisfactory photosensitive resin composition.

SUMMARY OF THE INVENTION

One aspect of the present invention provides a color filter photosensitive resin composition that is capable of providing an ultra-fine square pattern and that can leave minimal or no residues on unexposed parts or areas.

Another aspect of the present invention provides a color filter prepared using the photosensitive resin composition.

According to one aspect of the present invention, a color filter photosensitive resin composition is provided, which includes (A) an acryl-based binder resin having at least one carboxyl group, (B) an acryl-based photopolymerizable monomer, (C) a photopolymerization initiator, and (D) a solvent, where at least one of the acryl-based binder resin or the acryl-based photopolymerizable monomer includes a blue dye functional group.

According to another aspect of the present invention, provided is a color filter prepared using the photosensitive resin composition.

Since the color filter photosensitive resin composition of the present invention includes an acryl-based binder resin including a blue dye functional group or an acryl-based photopolymerizable monomer including a blue dye functional group, it can improve heat resistance and color fastness of the dye compared with a conventional dye-type photosensitive resin composition, and also uniformity, compared with a conventional pigment-type photosensitive resin composition. Thus, it can from an ultra-fine square pattern and leaves minimum or no residue on unexposed parts.

DETAILED DESCRIPTION OF THE INVENTION

Figure 1:
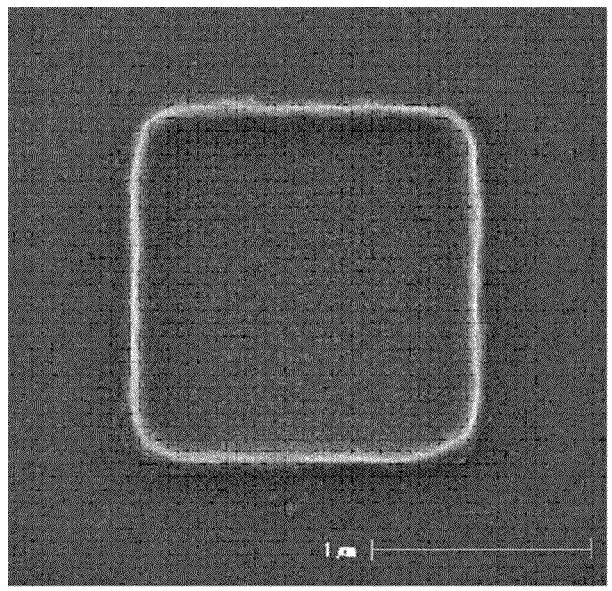
FIG. 1 is a photograph showing pixels formed of a photosensitive resin composition according to Example 1.

The present invention will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

A color filter photosensitive resin composition according to one embodiment of the present invention includes (A) an acryl-based binder resin having at least one carboxyl group, (B) an acryl-based photopolymerizable monomer, (C) a photopolymerization initiator, and (D) a solvent, where at least one of the acryl-based binder resin or the acryl-based photopolymerizable monomer includes a blue dye functional group.

As used herein, unless a specific definition is otherwise provided, the term "alkyl group" refers to a $C_1$-$C_{15}$ alkyl group, the term "alkylene group" refers to a $C_1$-$C_{15}$ alkylene group, the term "alkenyl group" refers to a $C_2$-$C_{16}$ alkenyl group, the term "alkenylene group" refers to a $C_2$-$C_{16}$ alkenylene group, the term "alkynyl group" refers to a $C_2$-$C_{16}$ alkynyl group, the term "alkynylene group" refers to a $C_2$-$C_{16}$ alkynylene group, the term "aryl group" refers to a $C_6$-$C_{18}$ aryl group, the term "arylene group" refers to a $C_6$-$C_{18}$ arylene group, the term "arylalkyl group" refers to a $C_7$-$C_{18}$ arylalkyl group, the term "heteroalkyl group" refers to a $C_1$-$C_{20}$ heteroalkyl group, the term "heterocycloalkyl group" refers to a $C_2$-$C_{20}$ heterocycloalkyl group, the term "heteroaryl group" refers to a $C_2$-$C_{20}$ heteroaryl group, the term "heteroarylalkyl group" refers to a $C_3$-$C_{20}$ heteroarylalkyl group, the term "cycloalkyl group" refers to a $C_3$-$C_{15}$ cycloalkyl group, the term "cycloalkenyl group" refers to a $C_3$-$C_{15}$ cycloalkenyl group, the term "cycloalkynyl group" refers to a $C_6$-$C_{15}$ cycloalkynyl group, and the term "alkoxy group" refers to a $C_1$-$C_{20}$ alkoxy group.

As used herein, unless a specific definition is otherwise provided, the term "substituted" refers to one substituted with at least one or more substituents comprising halogen (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or salts thereof, a sulfonic acid group or salts thereof, a phosphoric acid group or salts thereof, a $C_1$-$C_{15}$ alkyl group, a $C_2$-$C_{16}$ alkenyl group, a $C_2$-$C_{16}$ alkynyl group, a $C_6$-$C_{18}$ aryl group, a $C_7$-$C_{18}$ arylalkyl group, a $C_1$-$C_{20}$ heteroalkyl group, a $C_2$-$C_{20}$ heterocyclic group, a $C_3$-$C_{20}$ heteroarylalkyl group, a $C_3$-$C_{15}$ cycloalkyl group, a $C_3$-$C_{15}$ cycloalkenyl group, a $C_6$-$C_{15}$ cycloalkynyl group, or a combination thereof.

As used herein, unless a specific definition is otherwise provided, the terms "heteroalkyl group", "heterocycloalkyl group", "heteroaryl group" and "heteroarylalkyl group" refer to alkyl, cycloalkyl, aryl and arylalkyl groups, respectively, as defined herein in which carbon atoms in a ring are substituted with 1 to 15, for example 1 to 5, heteroatoms selected from N, O, S, Si, and P atoms, and combinations thereof, with the remaining atoms in the ring being carbon atoms.

Exemplary components included in a color filter photosensitive resin composition according to embodiments of the present invention will hereinafter be described in detail.

(A) Acryl-based Binder Resin Having at Least One Carboxyl Group

The acryl-based binder resin having at least one carboxyl group (A) includes a copolymer of i) a first ethylenic unsaturated monomer including at least one carboxyl group and ii) a second ethylenic unsaturated monomer copolymerizable with the first ethylenic unsaturated monomer.

Exemplary first ethylenic unsaturated monomers including at least one carboxyl group i) include, but are not limited to, acrylic acid, methacrylic acid, maleic acid, itaconic acid, fumaric acid, succinic acid, and the like, and combinations thereof.

The acryl-based binder resin can include the first ethylenic unsaturated monomer including at least one carboxyl group i) in an amount of about 5 to about 40 wt % or about 10 to about 35 wt %, based on the total weight of the acryl-based binder resin.

When the first ethylenic unsaturated monomer including at least one carboxyl group is included within the above ranges, it can contribute to obtaining appropriate developability.

Exemplary second ethylenic unsaturated monomers ii) include, but are not limited to, alkenyl aromatic compounds, unsaturated carboxylic acid ester compounds, unsaturated carboxylic acid amino alkyl ester compounds, carboxylic acid vinyl ester compounds, unsaturated carboxylic acid glycidyl ester compounds, vinyl cyanide compounds, unsaturated amide compounds, and the like, and combinations thereof.

Exemplary alkenyl aromatic compounds include but are not limited to styrene, α-methyl styrene, vinyl toluene, vinyl benzyl methyl ether, and the like, and combinations thereof. Exemplary unsaturated carboxylic acid ester compounds include but are not limited to methyl acrylate, methyl methacrylate, ethyl acrylate, ethyl methacrylate, butyl acrylate, butyl methacrylate, 2-hydroxy ethyl acrylate, 2-hydroxy ethyl methacrylate, 2-hydroxy butyl acrylate, 2-hydroxy butyl methacrylate, benzyl acrylate, benzyl methacrylate, cyclohexyl acrylate, cyclohexyl methacrylate, phenyl acrylate, and the like, and combinations thereof. Exemplary unsaturated carboxylic acid amino alkyl ester compounds include but are not limited to 2-amino ethyl acrylate, 2-amino ethyl methacrylate, 2-dimethyl amino ethyl acrylate, 2-dimethyl amino ethyl methacrylate, and the like, and combinations thereof. Exemplary carboxylic acid vinyl ester compounds include but are not limited to vinyl acetate, vinyl benzoate, and the like, and combinations thereof. Exemplary unsaturated carboxylic acid glycidyl ester compounds include but are not limited to glycidyl acrylate, glycidyl methacrylate, and the like, and combinations thereof. Exemplary vinyl cyanide compounds include but are not limited to acrylonitrile, methacrylonitrile, and the like, and combinations thereof. Exemplary unsaturated amide compounds include but are not limited to acryl amide, methacryl amide, and the like, and combinations thereof. The acryl-based binder resin having at least one carboxyl group (A) includes at least one of the above-described compounds as a second monomer.

The acryl-based binder resin may include the ii) second ethylenic unsaturated monomer in a balance amount or in an amount of about 1 to about 60 wt %.

The acryl-based binder resin having at least one carboxyl group (A) has the most influence on resolution and color characteristic of pixels. In particular, the resolution of pixels largely depends on the acid value and molecular weight of a binder resin.

The acryl-based binder resin having at least one carboxyl group may further include a blue dye functional group.

In other words, it may be a resin integrated with a dye.

The blue dye functional group may include a structure of metal phthalocyanine-based dye.

The acryl-based binder resin having at least one carboxyl group (A) may further include iii) a third ethylenic unsaturated monomer including a blue dye functional group and can be represented by the following Chemical Formula 1.

[Chemical Formula 1]

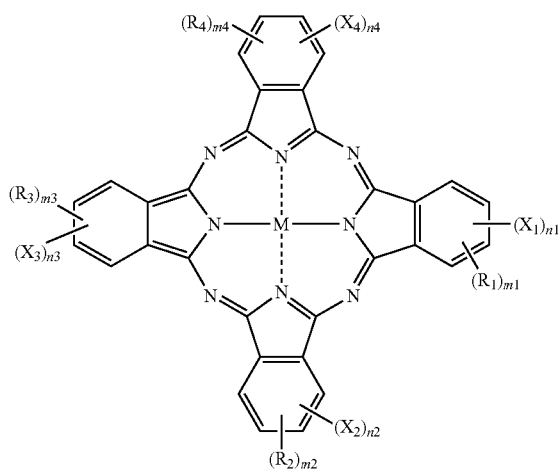

In the above Chemical Formula 1,

M is a transition element, for example copper or zinc, $X_1$ to $X_4$ are each independently hydrogen or a group represented by the following Chemical Formula 2, provided that at least one of $X_1$ to $X_4$ is represented by the following Chemical Formula 2, $R_1$ to $R_4$ are each independently hydrogen or C1 to C7 alkyl group, and $m_l$ to $m_4$ and $n_1$ to $n_4$ are each independently integers ranging from 0 to 4, wherein $m_1+n_1$, $m_2+n_2$, $m_3+n_3$, and $m_4+n_4$ are 4.

[Chemical Formula 2]

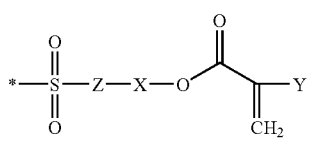

In the above Chemical Formula 2,

X is substituted or unsubstituted C2 to C12 hydrocarbon group, for example substituted or unsubstituted C2 to C8 hydrocarbon group.

The hydrocarbon group may include a saturated C2 to C12 alkylene group, a C2 to C12 alkenylene group, a C2 to C12 alkynylene group, or a C6 to C12 arylene group.

At least one or more hydrogen atom(s) of the hydrocarbon group of the substituent marked as X can be replaced with a halogen atom (halogen indicates F, Cl, Br, or I); a hydroxy group; a nitro group; a cyano group; an amino group; an azido group; an amido group; a hydrazine group; a hydrazone group; a carbonyl group; a substituted or unsubstituted ester group; a carbamyl group; a substituted or unsubstituted $C_1$ to $C_{20}$ alkoxy group; a substituted or unsubstituted carboxyl group or salts thereof; a substituted or unsubstituted sulfonic acid group or salts thereof; a substituted or unsubstituted phosphoric acid group or salts thereof; a substituted or unsubstituted $C_1$ to $C_{15}$ alkyl group such as methyl, ethyl, propyl, isopropyl, isobutyl, and the like; a substituted or unsubstituted $C_2$ to $C_{16}$ alkenyl group such as vinyl, propenyl, butenyl, and the like; a substituted or unsubstituted $C_2$ to $C_{16}$ alkynyl group such as ethynyl and the like; a substituted or unsubstituted $C_6$ to $C_{18}$ aryl group such as phenyl, naphthyl, tetrahydronaphthyl, indan, biphenyl, and the like; a substituted or unsubstituted $C_7$ to $C_{18}$ arylalkyl group such as benzyl, phenylethyl, and the like; a substituted or unsubstituted $C_1$ to $C_{20}$ heteroalkyl group including nitrogen, sulfur, oxygen, silicon, phosphorus or a combination thereof in an alkyl group; a substituted or unsubstituted $C_2$ to $C_{20}$ heteroaryl group including 1, 2, 3, 4 or more heteroatoms selected from nitrogen, sulfur, oxygen, silicon, phosphorus, or a combination thereof, such as but not limited to thienyl, furyl, benzothienyl, pyridyl, pyrazinyl, pyrimidinyl, and the like; a substituted or unsubstituted $C_3$ to $C_{20}$ heteroarylalkyl group; a substituted or unsubstituted $C_3$ to $C_{15}$ cycloalkyl group; a substituted or unsubstituted $C_3$ to $C_{15}$ cycloalkenyl group such as cyclopentadienyl, and the like; a substituted or unsubstituted $C_6$ to $C_{15}$ cycloalkynyl group; a substituted or unsubstituted $C_3$ to $C_{20}$ heterocycloalkyl group such as aziridinyl, pyrrolidinyl, piperidinyl, and the like, or a combination thereof.

In the above Chemical Formula 2, Z is NH or oxygen, and Y is hydrogen or C1 to C7 alkyl group, for example hydrogen or methyl.

The acryl-based binder resin may include the third ethylenic unsaturated monomer iii) in an amount of about 1 to about 70 wt %, for example about 10 to about 60 wt %, and as another example about 15 to about 50 wt %, based on the total weight of the acryl-based binder resin.

When the acryl-based binder resin includes the third ethylenic unsaturated monomer in an amount within these ranges, the composition may have excellent color characteristics, developability, solubility, and the like.

The acryl-based binder resin formed by copolymerizing the monomers i) or iii) has no limit in terms of shape, and thereby can be a random copolymer, an alternative copolymer, or a block copolymer.

The acryl-based binder resin can have an acid value ranging from about 10 to about 150 mg KOH/g, for example about 90 to about 150 mg KOH/g.

In addition, the acryl-based binder resin can have a weight average molecular weight (Mw) ranging from about 1000 to about 200,000, for example about 5000 to about 100,000, and as another example about 8000 to about 30,000.

The photosensitive resin composition may include the acryl-based binder resin in an amount of about 1 to about 70 wt %, for example about 1.5 to about 40 wt %, based on the entire weight of the photosensitive resin composition.

When the acryl-based binder resin is included in the photosensitive resin composition in an amount within the aforementioned ranges, the composition may have excellent color characteristics, excellent developability for an alkali development solution, and excellent cross-linking. Accordingly, it may not have a deteriorated close contacting (adhesive) property with a substrate, so that a pattern may not be readily peeled off or removed.

(B) Acryl-based Photopolymerizable Monomer

The acryl-based photopolymerizable monomer may be any of the types of monomers generally used for a color filter photosensitive resin composition. Examples of the acryl-based photopolymerizable monomer include without limitation dipentaerythritolhexaacrylate, ethyleneglycoldiacrylate, triethyleneglycoldiacrylate, 1,4-butanedioldiacrylate, 1,6-hexanedioldiacrylate, neopentylglycoldiacrylate, pentaerythritoldiacrylate, pentaerythritoltriacrylate, dipentaerythritoldiacrylate, dipentaerythritoltriacrylate, dipentaerythritolpentaacrylate, pentaerythritolhexaacrylate, bisphenol A diacrylate, trimethylolpropanetriacrylate, novolacepoxyacrylate, ethyleneglycoldimethacrylate, diethyleneglycoldimethacrylate, triethyleneglycoldimethacrylate, propyleneglycol dimethacrylate, 1,4-butanedioldimethacrylate, 1,6-hexanedioldimethacrylate, and the like, and combinations thereof.

The photosensitive resin composition may include the acryl-based photopolymerizable monomer in an amount of about 0.5 to about 20 wt %, based on the total weight of the photosensitive resin composition.

When the photosensitive resin composition includes the acryl-based photopolymerizable monomer in an amount within the above range, the composition may form a pattern having a clear edge and excellent development with an alkali development solution.

In addition, the acryl-based photopolymerizable monomer may include a blue dye functional group.

In other words, it may be integrated with the blue dye functional group.

Herein, the blue dye functional group can be a structure of metal phthalocyanine-based dye.

The acryl-based photopolymerizable monomer can be represented by the following Chemical Formula 1.

[Chemical Formula 1]

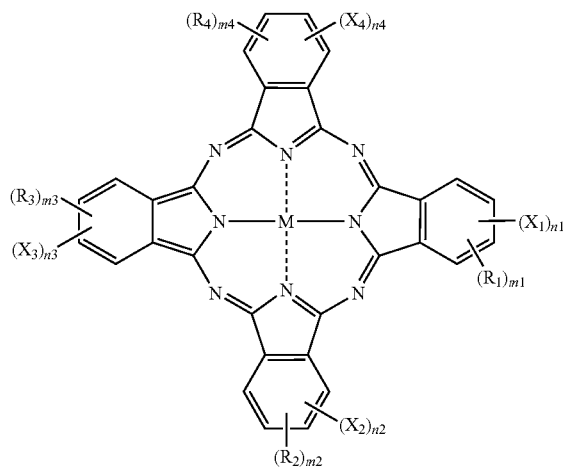

In the above Chemical Formula 1,

M is a transition element, for example, copper or zinc, $X_1$ to $X_4$ are each independently hydrogen or a group represented by the following Chemical Formula 2, provided that at least one of $X_1$ to $X_4$ is represented by the following Chemical Formula 2, $R_1$ to $R_4$ are each independently hydrogen or C1 to C7 alkyl group, and $m_1$ to $m_4$ and $n_1$ to $n_4$ are each independently integers ranging from 0 to 4, wherein $m_1+n_1$, $m_2+n_2$, $m_3+n_3$, and $m_4+n_4$ are 4.

[Chemical Formula 2]

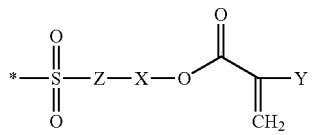

In the above Chemical Formula 2,

X is substituted or unsubstituted C2 to C12 hydrocarbon group, for example substituted or unsubstituted C2 to C8 hydrocarbon group.

The hydrocarbon group may include a saturated C2 to C12 alkylene group, a C2 to C12 alkenylene group, a C2 to C12 alkynylene group, or a C6 to C12 arylene group.

Herein, at least one hydrogen atom of the hydrocarbon group of the substituent marked as X can be replaced with a halogen atom (halogen is F, Cl, Br, or I); a hydroxy group; a nitro group; a cyano group; an amino group; an azido group; an amido group; a hydrazine group; a hydrazone group; a carbonyl group; a substituted or unsubstituted ester group; a carbamyl group; a substituted or unsubstituted $C_1$ to $C_{20}$ alkoxy group; a substituted or unsubstituted carboxyl group or salts thereof; a substituted or unsubstituted sulfonic acid group or salts thereof; a substituted or unsubstituted phosphoric acid group or salts thereof; a substituted or unsubstituted $C_1$ to $C_{15}$ alkyl group such as methyl, ethyl, propyl, isopropyl, isobutyl, and the like; a substituted or unsubstituted $C_2$ to $C_{16}$ alkenyl group such as vinyl, propenyl, butenyl, and the like; a substituted or unsubstituted $C_2$ to $C_{16}$ alkynyl group such as ethinyl, and the like; a substituted or unsubstituted $C_6$ to $C_{18}$ aryl group such as phenyl, naphthyl, tetrahydronaphthyl, indan, cyclopentadienyl, biphenyl, and the like; a substituted or unsubstituted $C_7$ to $C_{18}$ aryl alkyl group such as benzyl, phenylethyl, and the like; a substituted or unsubstituted $C_1$ to $C_{20}$ heteroalkyl group including nitrogen, sulfur, oxygen, silicon, phosphorus, or a combination thereof in an alkyl group; a substituted or unsubstituted $C_2$ to $C_{20}$ heteroaryl group including 1, 2, 3, 4 or more heteroatoms selected from nitrogen, sulfur, oxygen, silicon, phosphorus or a combination thereof such as but not limited to thienyl, furyl, benzothienyl, pyridyl, pyrazinyl, pyrimidinyl, and the like; a substituted or unsubstituted $C_3$ to $C_{20}$ heteroarylalkyl group; a substituted or unsubstituted $C_3$ to $C_{15}$ cycloalkyl group; a substituted or unsubstituted $C_3$ to $C_{15}$ cycloalkenyl group such as cyclopentadienyl, and the like; a substituted or unsubstituted $C_6$ to $C_{15}$ cycloalkynyl group; a substituted or unsubstituted $C_3$ to $C_{20}$ heterocycloalkyl group such as aziridinyl, pyrrolidinyl, piperidinyl, and the like, or a combination thereof.

In the above Chemical Formula 2, Z is NH or oxygen, and Y is hydrogen or C1 to C7 alkyl group, for example hydrogen or methyl.

The photosensitive resin composition can include the acryl-based photopolymerizable monomer including a blue dye functional group represented by the above Chemical Formula 1 in an amount of about 3 to about 30 wt %, for example about 5 to about 20 wt %, based on the entire weight of the photosensitive resin composition.

When the acryl-based photopolymerizable monomer is included in the photosensitive resin composition in an amount within the above ranges, it may improve color purity, and thus provide highly-quality images. The composition may also have an excellent cure degree of a pattern and thereby improve the close contacting property (adhesion) with a substrate, forming a pattern with an appropriate size.

In addition, it can contribute to forming a pattern with a clear edge and excellent development with an alkali development solution.

(C) Photopolymerization Initiator

The photopolymerization initiator may include any photopolymerization initiator that is generally used for a photosensitive resin composition, for example, an acetophenone-based compound, a benzophenone-based compound, a thioxanthone-based compound, a benzoin-based compound, a triazine-based compound, an oxime-based compound, and the like, and combinations thereof.

Exemplary acetophenone-based compounds may include without limitation 2,2'-diethoxyacetophenone, 2,2'-dibutoxyacetophenone, 2-hydroxy-2-methylfluorophenone, p-t-butyltrichloroacetophenone, p-t-butyldichloroacetophenone, 4-chloroacetophenone, 2,2'-dichloro-4-phenoxyacetophenone, 2-methyl-1-(4-(methylthio)phenyl)-2-morpholinopropane-1-one, or 2-benzyl-2-dimethylamino-1-(4-morpholinophenyl)-butane-1-one, and the like, and combinations thereof.

Exemplary benzophenone-based compounds may include without limitation benzophenone, benzoyl benzoic acid, benzoyl benzoic acid methyl, 4-phenyl benzophenone, hydroxy benzophenone, acrylic benzophenone, 4,4'-bis(dimethylamino)benzophenone, 4,4'-bis(diethylamino)benzophenone, 4,4'-dichlorobenzophenone, 3,3'-dimethyl-2-methoxybenzophenone, and the like, and combinations thereof.

Exemplary thioxanthone-based compounds may include without limitation thioxanthone, 2-methylthioxanthone, isopropyl thioxanthone, 2,4-diethyl thioxanthone, 2,4-diisopropyl thioxanthone, 2-chlorothioxanthone, and the like, and combinations thereof.

Exemplary benzoin-based compounds may include without limitation benzoin, benzoin methyl ether, benzoin ethyl ether, benzoin isopropyl ether, benzoin isobutyl ether, benzyldimethylketal, and the like, and combinations thereof.

Exemplary triazine-based compounds may include without limitation 2,4,6-trichloro s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, bis(trichloromethyl)-6-styryl s-triazine, 2-(naphto1-yl)-4,6-bis(trichloromethyl)-s-triazine, 2-(4-methoxynaphtol-yl)-4,6-bis(trichloromethyl)-s-triazine, 2,4-trichloro methyl(piperonyl)-6-triazine, 2,4-trichloro methyl (4'-methoxystyryl)-6-triazine, 2-piperonyl-4,6-bis(trichloromethyl)-1,3,5-triazine, and the like, and combinations thereof.

Exemplary oxime-based compounds may include without limitation 2-(o-benzoyloxime)-1-[4-(phenylthio)phenyl]-1,2-octanedione, 1-(o-acetyloxime)-1-[9-ethyl-6-(2-methylbenzoyl)-9H-carbazol-3-yl]ethanone, and the like, and combinations thereof.

The photopolymerization initiator may include a carbazole-based compound, a diketone-based compound, a sulfonium borate-based compound, diazo-based, non-imidazole-based compound, or the like, instead of the above photopolymerization initiators.

The photosensitive resin composition may include the photopolymerization initiator in an amount of about 0.1 to about 5 wt %, based on the total weight of the photosensitive resin composition.

When the photopolymerization initiator is included in the photosensitive resin composition in an amount within the above range, it may cause sufficient photopolymerization during the pattern forming process when exposed to light. In addition, the unreacted initiator left after the photopolymerization may not deteriorate transmittance.

(D) Solvent

Exemplary solvents may include without limitation an ethylene glycol compound such as ethylene glycol, diethylene glycol, and the like; a glycolether compound such as ethylene glycol monomethylether, diethylene glycol monomethylether, ethylene glycol diethylether, diethylene glycol dimethylether, and the like; a glycoletheracetate compound such as ethylene glycol monoethyletheracetate, diethylene glycol monoethyletheracetate, diethylene glycol monobutyletheracetate, and the like; a propylene glycol compound such as propylene glycol and the like; a propylene glycol ether compound such as propylene glycol monomethylether, propylene glycol monoethylether, propylene glycol monopropylether, propylene glycol monobutylether, propylene glycol dimethylether, dipropylene glycol dimethylether, propylene glycol diethylether, dipropylene glycol diethylether, and the like; a propylene glycol etheracetate compound such as propylene glycol monomethyletheracetate, dipropylene glycol monoethyletheracetate, and the like; an amide compound such as N-methylpyrrolidone, dimethyl formamide, dimethyl acetamide, and the like; a ketone compound such as methylethylketone (MEK), methylisobutylketone (MIBK), cyclohexanone, and the like; a petroleum compound such as toluene, xylene, solvent naphtha, and the like; and an ester compound such as acetic acidethyl, acetic acidbutyl, ethyl lactate, and the like. These solvent may be used singly or in combination.

The photosensitive resin composition can include the solvent in a balance amount or in an amount of about 20 to about 90 wt %, based on the total weight of the photosensitive resin composition.

When the solvent is included in the photosensitive resin composition within the above ranges, the photosensitive resin composition may have excellent coating properties. In addition, it can maintain flatness when it is coated to a thickness of 1 μm or more.

(E) Other Additives

The color filter photosensitive resin composition may include other additives such as malonic acid, 3-amino-1,2-propanediol, a coupling agent, a leveling agent, a fluorine-based surfactant, a silicone-based surfactant, and the like, and combinations thereof, in addition to the components (A) to (D) as discussed herein in order to prevent a stain or a spot during the coating and generation of a residue due to non-development and to control leveling.

Exemplary fluorine-based surfactants may include without limitation Megaface F-142D, F-172, F-172D, F-177P, F-470, F-471, F-475, F-482, and the like, which are made by Dainippon Ink and Chemicals, Inc.

Exemplary silicone-based surfactants may include without limitation TSF400, TSF401, TSF410, TSF4440, and the like, made by GE Toshiba Silicones Co., Ltd.

According to another embodiment of the present invention, provided is a color filter fabricated by using the photosensitive resin composition. The photosensitive resin composition enables the formation of ultra-fine pixels having a square shape without leaving any residue (or minimal residue) on unexposed areas, for example a pattern of pixels having a square shape and a pixel size of 1.4 μm or less, for example of 1.35 μm or less, and as another example a pixel size from 1 μm to 1.4 μm. Thus the present invention can provide a color filter having uniformity, almost no residue, and high resolution due to ultrafine pixels of 1.4 μm or less.

The color filter can be fabricated by coating the photosensitive resin composition to a thickness of about 5000 to about 8000 Å on a wafer for a color filter using an appropriate coating method such as spin-coating, slit-coating, and the like, exposing the photosensitive resin composition layer to light, and treating the layer with an alkali development solution to dissolve the unexposed part, thereby forming a pattern for a color filter.

The light source can be 356 nm I-line light.

The color filter can have a desired pattern by repeating the process depending on the number of R, G, and B colors.

In this process, the developed image pattern can be cured through heating, exposing to actinic rays, or the like to improve crack resistance, solvent resistance, and the like.

In addition, the color filter can have a remarkably fine square pattern.

Accordingly, it can have high resolution when it is used with an image sensor.

The following examples illustrate the present invention in more detail. However, it is understood that the present invention is not limited by these examples.

Preparation of an Acryl-based Photopolymerizable Monomer Including a Functional Group of Blue Dye

SYNTHESIS EXAMPLE 1

200 g of chlorosulfonic acid is put in a 500 Ml round-bottomed flask with a refluxing cooler and an agitator, and 20 g of a copper phthalocyanine dye is slowly added thereto and dissolved therein. Then, 16 g of thionylchloride is slowly added thereto. The mixture is heated to 120° C. and agitated for 5 hours.

The reactant is cooled to room temperature and slowly added to 6000 g of ice water, and strongly agitated, preparing a slurry. The slurry is filtrated and washed with distilled water, obtaining a pressed cake.

The pressed cake is made into a slurry in 100 Ml of distilled water, and 40.2 g of 6-amino-1-hexanol is added thereto. The resulting mixture is reacted at room temperature for 3 hours and at 60° C. for 3 hours again.

The reactant is filtrated and washed with distilled water again, and then dried in an oven, obtaining a product.

Copper phthalocyanine substituted with 6-amino-1-hexanol is put in a round-bottomed flask including 100 Ml cyclohexanone and dissolved therein. 9.6 g of triethylamine, 4.6 g of N,N-dimethylaminopyridine, and 29.2 g of methacrylic acidanhydride are added thereto. The resulting mixture is reacted at room temperature for 16 hours and then added to an excess amount of distilled water to produce a precipitate. The precipitate is filtrated, washed with distilled water, and dried, preparing 26.1 g of a methacryl monomer including copper phthalocyanine as a pendant functional group. This product is represented by the following Chemical Formula 1a (wherein X is $C_6H_{12}$, M is Cu, and Y is $CH_3$).

[Chemical Formula 1a]

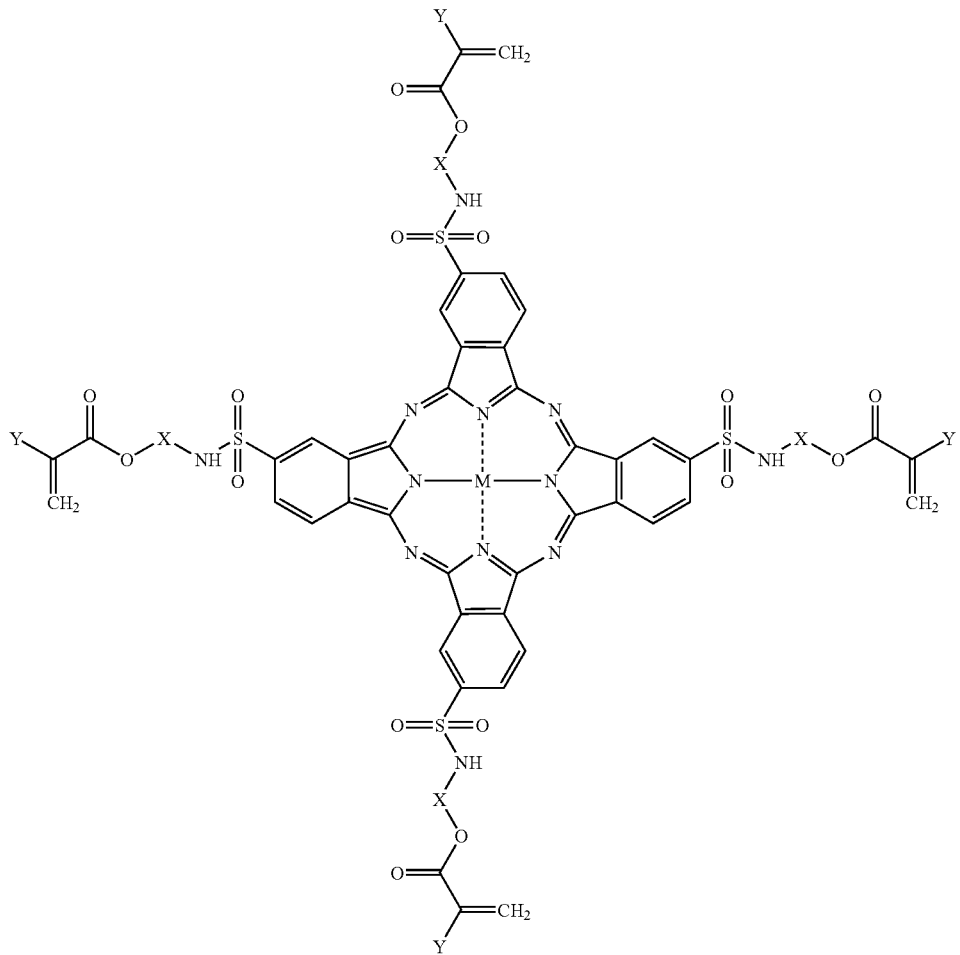

SYNTHESIS EXAMPLE 2

An acryl-based photopolymerizable monomer including a functional group of blue dye is prepared according to the same method as Synthesis Example 1, except for using 6-amino-1-pentenol instead of the 6-amino-1-hexanol of Synthesis Example 1.

SYNTHESIS EXAMPLE 3

An acryl-based photopolymerizable monomer including a functional group of blue dye is prepared according to the same method as Synthesis Example 1, except for using 6-amino-1-butanol instead of the 6-amino-1-hexanol of Synthesis Example 1.

SYNTHESIS EXAMPLE 4

An acryl-based photopolymerizable monomer including a functional group of blue dye is prepared according to the same method as Synthesis Example 1, except for using 6-amino-1-propanol instead of the 6-amino-1-hexanol of Synthesis Example 1 and Zn phthalocyanine instead of copper phthalocyanine.

SYNTHESIS EXAMPLE 5

An acryl-based photopolymerizable monomer including a functional group of blue dye is prepared according to the same method as Synthesis Example 1, except for using 6-amino-1-dodecanol instead of the 6-amino-1-hexanol of Synthesis Example 1 and Zn phthalocyanine instead of copper phthalocyanine.

Preparation of a Color Filter Photosensitive Resin Composition

EXAMPLES 1 TO 5

24.19 g of an acryl-based binder resin (weight average molecular weight of 13,000, acid value of 95 mgKOH/g, and solids at 45.8 wt %) is prepared by copolymerizing benzyl methacrylate and methyl methacrylic acid in a weight ratio of 85/15. Then, 7.2 g of each functional group of blue dye-containing acryl-based photopolymerizable monomer according to Synthesis Examples 1 to 5, 0.64 g of a photopolymerization initiator (TPP, Ciba Specialty Chemicals Ltd.), and 51.56 g of propylene glycol monomethyletheracetate (PGMEA), 16.21 g of cyclohexanone, 0.2 g of a coupling agent (S710, Chisso Co.), and 0.2 g of a leveling agent (F-477, DIC Inc.) are added thereto. The mixture is agitated with a magnetic agitator for 2 hours and then filtrated with a 20 μm-deep filter, preparing a photosensitive resin composition.

COMPARATIVE EXAMPLE 1

A photosensitive resin composition is prepared according to the same method as Example 1, except for using 6.8 g of dipentaerythritolhexaacrylate (DPHA, Miwon Commercial Co., Ltd.) and 44.6 g of a blue pigment dispersion solution (Dongyang Ink Co., Ltd.) instead of the functional group of blue dye-containing acryl-based photopolymerizable monomer of Example 1.

COMPARATIVE EXAMPLE 2

A photosensitive resin composition is prepared according to the same method as Example 1, except for using 6.8 g of pentaerythritoltetraacrylate (PETA, Miwon Commercial Co., Ltd.) and 44.6 g of a blue pigment dispersion solution (Dongyang Ink Co., Ltd.) instead of the functional group of blue dye-containing acryl-based photopolymerizable monomer of Example 1.

COMPARATIVE EXAMPLE 3

A photosensitive resin composition is prepared according to the same method as Example 1, except for using 6.8 g of pentaerythritoltetraacrylate (PETA, Miwon Commercial Co., Ltd.) and 7.8 g of solvent blue 45 (Clariant Co. Ltd.) instead of the functional group of blue dye-containing acryl-based photopolymerizable monomer of Synthesis Example 1.

EXPERIMENTAL EXAMPLE 1

SEM Photograph Evaluation

The photosensitive resin compositions according to Examples 1 to 5 and Comparative Examples 1 to 3 are respectively coated on an 8-inch wafer by using a spin-coater (K-Spin, KDNS Co., Ltd.), then dried at 100° C. for 180 seconds, exposed to light at 100 ms to 600 ms using an i-line stepper equipped with a reticle having variously-sized patterns (NSR i10C, Nikon Co.), and developed at room temperature with a 0.2% TMAH solution for 120 seconds.

The developed substrate is cleaned and dried on a 200° C. high temperature plate for 300 seconds to form a pattern.

The pattern formed using photosensitive resin compositions of Example 1 and Comparative Example 1 are examined using a scanning electron microscope (SEM). The results are provided in FIGS. 1 and 2.

Figure 2:
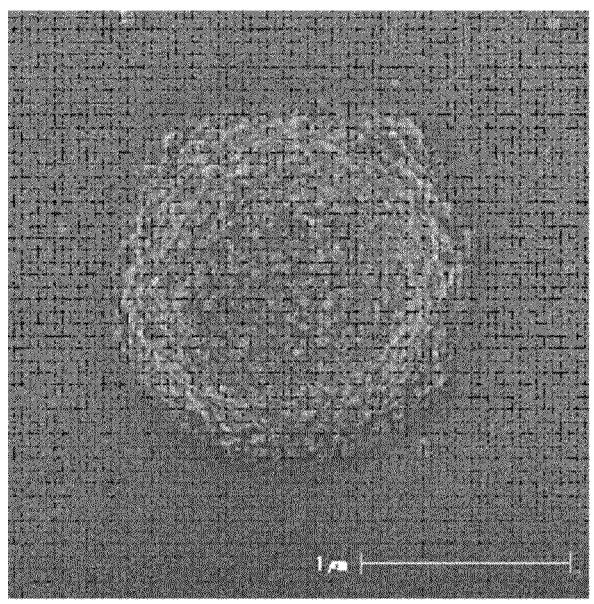
FIG. 2 is a photograph showing pixels formed of a photosensitive resin composition according to Comparative Example 1.

FIG. 1 is a photograph showing pixels prepared by using a photosensitive resin composition according to Example 1. FIG. 2 is a photograph showing pixels prepared by using a photosensitive resin composition according to Comparative Example 1.

Referring to FIGS. 1 and 2, the pixels prepared by using an acryl-based photopolymerizable monomer including a functional group of blue dye of Example 1 has a fine square pattern. The pixels prepared by the photosensitive resin composition of Comparative Example 1 has a deformed pattern.

EXPERIMENTAL EXAMPLE 2

Property Measurement

The patterns according to Examples 1 to 5 and Comparative Examples 1 to 3 are evaluated for profile, residue, close contacting (adhesive) property, and resolution. The results are provided in the following Table 1.

The resolution is examined with an optical microscope. The coating thickness is measured with ST4000-DLX (K-MAC Co.).

(1) Profile Evaluation

The pixel patterns (1.3×1.3 μm square) formed by using a 365 nm light source are cut, and the cross-sections are examined with an SEM.

A rectangular shape profile is indicated as O, a somewhat round shape profile as Δ, and a completely round shape as X.

(2) Residue

The pixel patterns (1.3×1.3 μm square) formed by using the 365 nm light source are cut, and the cross-sections are examined with an SEM. No residue on the exposure part is indicated as O, a little residue as Δ, and obvious residue as X.

(3) Close Contacting (Adhesive) Property

The close contacting (adhesive) property is evaluated by measuring minimum exposure time (range: 100 ms-600 ms) for which a pattern is not peeled off from a substrate.

(4) Resolution

The size of the smallest recognizable pixels is measured.

TABLE 1

| | Acryl-based photo-polymerizable monomer | Pixel pattern | | | |
|---|---|---|---|---|---|
| | | Shape | Residue | Close contacting property (ms) | Size (μm) |
| Example 1 | Synthesis Example 1 | O | O | 100 | 1.31 × 1.33 |
| Example 2 | Synthesis Example 2 | O | O | 100 | 1.29 × 1.30 |
| Example 3 | Synthesis Example 3 | O | O | 150 | 1.30 × 1.29 |
| Example 4 | Synthesis Example 4 | O | O | 100 | 1.28 × 1.30 |
| Example 5 | Synthesis Example 5 | Δ | O | 100 | 1.32 × 1.31 |
| Comparative Example 1 | DPHA | X | X | 200 | 1.58 × 1.55 |
| Comparative Example 2 | PETA | X | Δ | 250 | 1.49 × 1.48 |
| Comparative Example 3 | PETA | Δ | Δ | 300 | Unformed |

Referring to Table 1, pixels formed of the photosensitive resin compositions of Examples 1 to 5 have a finer square pattern than those formed of photosensitive resin compositions of Comparative Examples 1 to 3.

Without wishing to be bound by any explanation or theory of the invention, the inventors currently believe that the compositions of the invention exhibit improved properties because an acryl-based photopolymerizable monomer including a structure of metal phthalocyanine-based dye increases uniformity and solubility of the photosensitive composition.

Preparation of an Acryl-based Binder Resin Including a Functional Group of Blue Dye

SYNTHESIS EXAMPLE 6

50 g of cyclohexanone is put in a 250 Ml round-bottomed flask with a reflux cooler and an agitator, and heated to 80° C. while being agitated.

While it is still being agitated at 80° C., a mixture of 22.5 g of the monomer of Chemical Formula Ia, 7.5 g of methacrylic acid, 20 g of benzyl methacrylate, and 6.0 g of dimethyl-2,2'-azobis (2-methylpropinonate) is added to the flask in a dropwise fashion for 1 to 2 hours.

Then, the resulting mixture is reacted for 4 to 6 hours, and an appropriate amount of a cyclohexanone solvent is added thereto, acquiring an acryl-based binder resin having 43.5% of solids and including a functional group of blue dye and a carboxyl group.

This polymer is measured through gel permeation chromatography (hereinafter referred to be "GPC") and has an average molecular weight (Mw) of 8800.

SYNTHESIS EXAMPLES 7 TO 15

Each acryl-based binder resin is prepared according to the same method as Synthesis Example 6 by using a monomer provided in the following Table 2.

EXAMPLES 6 TO 15

A photosensitive resin composition is prepared by adding 5.3 g of dipentaerythritolhexaacrylate (DPHA, Miwon Commercial Co., Ltd.), 0.4 g of a photopolymerization initiator (TPP, Ciba Specialty Chemicals Ltd.), and 18.9 g of propylene glycol monomethyletheracetate (PGMEA) as a solvent, 11.8 g of cyclohexanone, 0.2 g of a silane coupling agent (S510, Chisso Co.), and 0.1 g of a leveling agent (F-482, DIC Co., Ltd.) to 13.3 g of the acryl-based binder resin including a functional group of blue dye according to Synthesis Examples 6 to 15, agitating the mixture for 2 hours with a magnetic agitator, and filtrating it with a 20 μm-deep filter.

COMPARATIVE EXAMPLE 4

A photosensitive resin composition is prepared according to the same method as Example 6, except for using 3.9 g of an acryl-based binder resin (NPR 1780, Miwon Commercial Co., Ltd.) and 6.7 g of blue solvent 45 (Clariant Co. Ltd.) instead of 13.3 g of an acryl-based binder resin including a functional group of blue dye.

COMPARATIVE EXAMPLE 5

A photosensitive resin composition is prepared according to the same method as Example 6, except for using 4.3 g of an acryl-based binder resin (NPR 1520, Miwon Commercial Co., Ltd.) and 21.5 g of a blue pigment dispersion solution (TS-0020, Donyang Ink Co.) instead of the acryl-based binder resin including a functional group of blue dye.

COMPARATIVE EXAMPLE 6

A photosensitive resin composition is prepared according to the same method as Example 6 except for using 4.1 g of an acryl-based binder resin (NPR 1130, Miwon Commercial Co., Ltd) and 6.7 g of a solvent blue 45 (Clariant Co. Ltd.) instead of the acryl-based binder resin including a functional group of blue dye.

TABLE 2

| | Monomer of Chemical Formula 1a | Composition (weight ratio) | Molecular weight (Mw) | Acid value (mgKOH/g) |
|---|---|---|---|---|
| Example 6 | (M: Cu, X: $C_6H_{12}$, Y: $CH_3$) | Monomer of Chemical Formula 1a/methacrylic acid/benzylmethacrylate (45/15/40) | 8800 | 95 |

TABLE 2-continued

| | Monomer of Chemical Formula 1a | Composition (weight ratio) | Molecular weight (Mw) | Acid value (mgKOH/g) |
|---|---|---|---|---|
| Example 7 | (M: Cu, X: $C_5H_{10}$, Y: $CH_3$) | Monomer of Chemical Formula 1a/methacrylic acid/benzylmethacrylate (50/15/30) | 12,500 | 97 |
| Example 8 | (M: Cu, X: $C_3H_6$, Y: $CH_3$) | Monomer of Chemical Formula 1a/methacrylic acid/benzylmethacrylate (50/17/28) | 10,500 | 98 |
| Example 9 | (M: Cu, X: $C_2H_4$, Y: $CH_3$) | Monomer of Chemical Formula 1a/methacrylic acid/methylmethacrylate (45/20/20) | 9600 | 105 |
| Example 10 | (M: Cu, X: $C_6H_{12}$, Y: H) | Monomer of Chemical Formula 1a/methacrylic acid/methylmethacrylate (50/20/20) | 10,300 | 100 |
| Example 11 | (M: Cu, X: $C_5H_{10}$, Y: H) | Monomer of Chemical Formula 1a/methacrylic acid/methylmethacrylate (45/20/35) | 11,200 | 102 |
| Example 12 | (M: Cu, X: $C_3H_6$, Y: H) | Monomer of Chemical Formula 1a/methacrylic acid/2-hydroxyethylacrylate (45/13/42) | 12,800 | 90 |
| Example 13 | (M: Cu, X: $C_2H_4$, Y: H) | Monomer of Chemical Formula 1a/methacrylic acid/styrene/2-hydroxyethylacrylate (50/15/20/15) | 7800 | 95 |
| Example 14 | (M: Zn, X: $C_6H_{12}$, Y: $CH_3$) | Monomer of Chemical Formula 1a/methacrylic acid/methylmethacrylate/styrene (50/15/10/25) | 13,200 | 96 |
| Example 15 | (M: Zn, X: $C_6H_{12}$, Y: $CH_3$) | Monomer of Chemical Formula 1a/methacrylic acid/methylmethacrylate/benzylmethacrylate (50/20/10/20) | 14,800 | 100 |
| Comparative Example 4 | — | methacrylic acid/benzylmethacrylate 15/85 | 14,900 | 96 |
| Comparative Example 5 | — | methacrylic acid/benzylmethacrylate/styrene (15/65/20) | 13,600 | 95 |
| Comparative Example 6 | — | 2-hydroxyethylacrylate/polyethyleneglycol/styrene (15/15/70) | 12,800 | — |

EXPERIMENTAL EXAMPLE 1

SEM Photograph Evaluation

The photosensitive resin compositions according to Examples 6 to 15 and Comparative Examples 4 to 6 are respectively coated on an 8-inch wafer with a spin-coater (K-Spin, KDNS Co., Ltd.), dried at 80° C. for 180 seconds, exposed to light for 250 ms with an i-line stepper equipped with a reticle having variously-sized patterns (NSR i10C, Nikon Co.), and developed at room temperature with a 0.2% TMAH solution for 120 seconds.

The developed substrate is cleaned and dried on a 200° C. high temperature plate for 300 seconds, forming a pattern.

The patterns formed by using the photosensitive resin compositions of Example 6 and Comparative Example 4 are examined with a scanning electron microscope (SEM). The results are provided in FIGS. 3 and 4.

Figure 3:
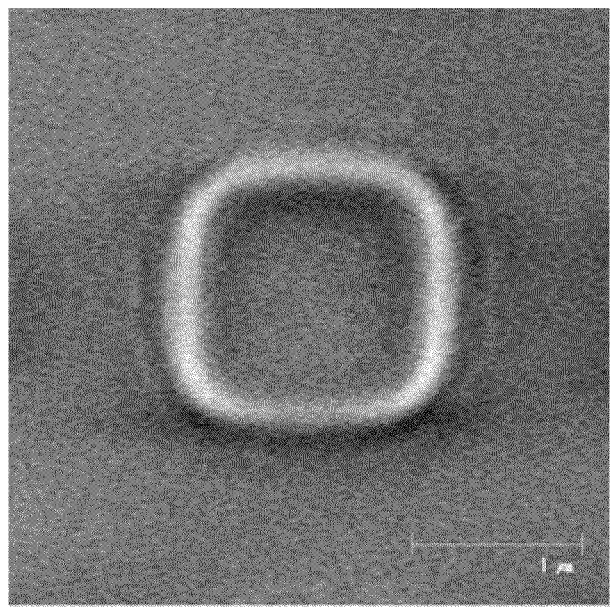
FIG. 3 is a photograph showing pixels formed of a photosensitive resin composition according to Example 6.
Figure 4:
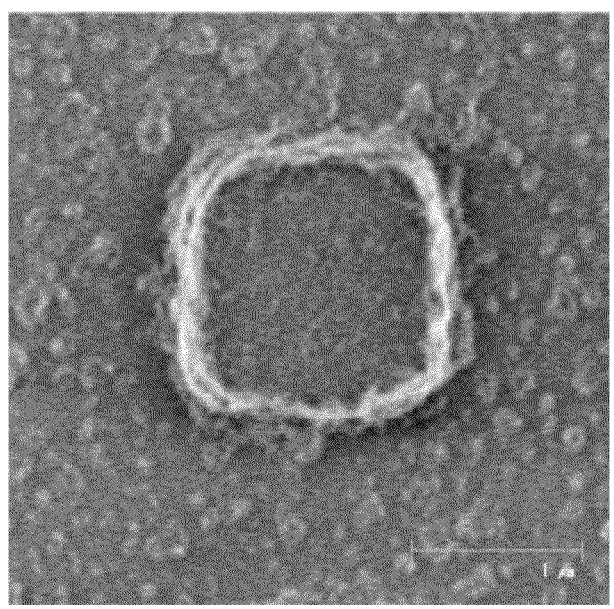
FIG. 4 is a photograph showing pixels formed of a photosensitive resin composition according to Comparative Example 4.

FIG. 3 is a photograph showing pixels formed of the photosensitive resin composition of Example 6, and FIG. 4 is a photograph showing pixels formed of the photosensitive resin composition of Comparative Example 4.

Referring to FIGS. 3 and 4, the pixels prepared by using an acryl-based photopolymerizable monomer including a functional group of blue dye of Example 6 have an excellent pattern profile. The pixels prepared by using the photosensitive resin composition of Comparative Example 4 have a deformed pattern profile.

EXPERIMENTAL EXAMPLE 2

Property Measurement

The patterns formed of the photosensitive resin compositions of Examples 6 to 15 and Comparative Examples 4 to 6 are evaluated for profile, residue, close contacting (adhesive) property, and resolution. The results are provided in the following Table 3.

The resolution is evaluated with an optical microscope, and the coating thickness is evaluated with ST4000-DLX equipment (K-MAC Co.).

(1) Profile Evaluation

The cross-section of the pixel pattern (1.3×1.3 μm square) formed by using a 365 nm light source is examined with an SEM.

A good rectangular shape profile is marked as O, a somewhat round profile as Δ, and a completely round profile as X.

(2) Residue

The cross-section of the 1.3×1.3 μm pixel pattern is examined with an SEM by using a 365 nm light source.

No residue on the unexposed part is marked as O, a little residue as Δ, and an obvious residue as X.

(3) Close Contacting (Adhesive) Property

The close contacting (adhesive) property is evaluated by measuring minimum exposure time (range: 100 ms-600 ms) in which a pattern is not peeled off from a substrate.

(4) Resolution

The size of the smallest but recognizable pixels is measured.

TABLE 3

| | Pixel pattern | | | |
|---|---|---|---|---|
| | Shape | Residue | Close contacting property (ms) | Resolution (μm) |
| Example 6 | ○ | ○ | 100 | 1.32 × 1.31 |
| Example 7 | ○ | ○ | 150 | 1.25 × 1.25 |
| Example 8 | ○ | ○ | 100 | 1.29 × 1.30 |
| Example 9 | ○ | ○ | 100 | 1.34 × 1.33 |
| Example 10 | ○ | ○ | 100 | 1.26 × 1.25 |
| Example 11 | Δ | ○ | 100 | 1.34 × 1.34 |
| Example 12 | ○ | ○ | 100 | 1.22 × 1.23 |
| Example 13 | Δ | ○ | 100 | 1.31 × 1.30 |
| Example 14 | ○ | ○ | 100 | 1.24 × 1.26 |
| Example 15 | Δ | ○ | 100 | 1.35 × 1.32 |
| Comparative Example 4 | X | Δ | 250 | 1.59 × 1.53 |
| Comparative Example 5 | X | X | 300 | 1.45 × 1.49 |
| Comparative Example 6 | Δ | X | 300 | No pattern |

As shown in Table 3, the pixels formed by using the photosensitive resin compositions according to Examples 6 to 15 have a finer square pattern than the ones formed by using the photosensitive resin compositions of Comparative Examples 4 to 6.

Without wishing to be bound by any explanation or theory of the invention, the inventors currently believe that the compositions of the invention exhibit improved properties because the acryl-based binder resin including a functional group of blue dye increased solubility.

Many modifications and other embodiments of the invention will come to mind to one skilled in the art to which this invention pertains having the benefit of the teachings presented in the foregoing description. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A color filter photosensitive resin composition comprising (A) an acryl-based binder resin having at least one carboxyl group;

(B) an acryl-based photopolymerizable monomer;

(C) a photopolymerization initiator; and (D) a solvent, wherein at least one of the acryl-based binder resin or the acryl-based photopolymerizable monomer includes a monomer including a blue dye functional group represented by the following Chemical Formula 1:

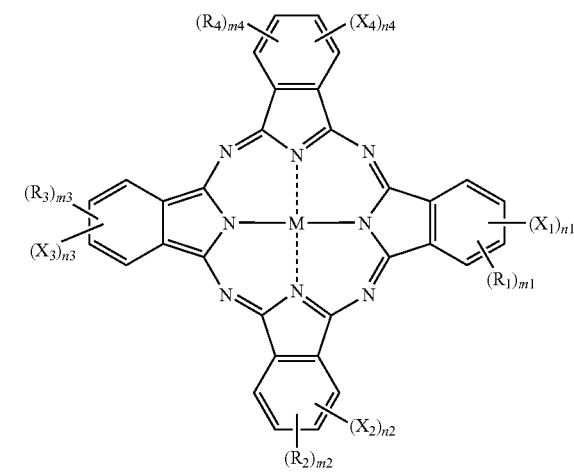

[Chemical Formula 1]

wherein in the above Chemical Formula 1,

M is a transition element, $X_1$ to $X_4$ are each independently hydrogen or a group represented by the following Chemical Formula 2, provided that at least one of $X_1$ to $X_4$ is represented by the following Chemical Formula 2, $R_1$ to $R_4$ are each independently hydrogen or C1 to C7 alkyl, and m1 to m4 and n1 to n4 are each independently integers ranging from 0 to 4, wherein m1+n1, m2+n2, m3+n3, and m4+n4 are 4,

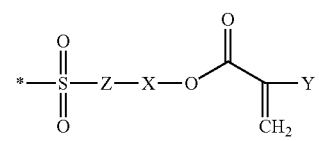

[Chemical Formula 2]

wherein in the above Chemical Formula 2,

X is substituted or unsubstituted C2 to C12 hydrocarbon,

Z is NH or oxygen, and

Y is hydrogen or C1 to C7 alkyl, wherein when the acryl-based binder resin (A) includes the blue dye functional group, the acryl-based binder resin (A) comprises a copolymer of i) a first ethylenic unsaturated monomer including at least one carboxyl group, ii) a second ethylenic unsaturated monomer that is copolymerizable with the first ethylenic unsaturated monomer, and iii) a third ethylenic unsaturated monomer including the blue dye functional of Chemical Formula 1 in an amount of about 1 to about 70 wt % based on the total weight of the acryl-based binder resin.

2. The color filter photosensitive resin composition of claim 1, wherein the acryl-based binder comprises a blue dye functional group, and the photosensitive resin composition comprises:

about 1 to about 70 wt % of the acryl-based binder resin (A) including at least one carboxyl group and the blue dye functional group;

about 0.5 to about 20 wt % of the acryl-based photopolymerizable monomer (B);

about 0.1 to about 5 wt % of the photopolymerization initiator (C); and balance of the solvent (D).

3. The color filter photosensitive resin composition of claim 1, wherein the first ethylenic unsaturated monomer i) comprises acrylic acid, methacrylic acid, maleic acid, itaconic acid, fumaric acid, succinic acid, or a combination thereof.

4. The color filter photosensitive resin composition of claim 1, wherein the acryl-based binder resin comprises the first ethylenic unsaturated monomer i) in an amount of about 5 to about 40 wt % based on the total weight of the acryl-based binder resin comprises.

5. The color filter photosensitive resin composition of claim 1, wherein the second ethylenic unsaturated monomer ii) comprises an alkenyl aromatic compound, an unsaturated carboxylic acid ester compound, an unsaturated carboxylic acid amino alkyl ester compound, a carboxylic acid vinyl ester compound, an unsaturated carboxylic acid glycidyl ester compound, a vinyl cyanide compound, an unsaturated amide compound, or a combination thereof 6. The color filter photosensitive resin composition of claim 1, wherein the acryl-based binder resin has a weight average molecular weight (Mw) of about 1000 to about 200,000.

7. The color filter photosensitive resin composition of claim 1, wherein the acryl-based binder resin has an acid value ranging from about 10 to about 150 mg KOH/g.

8. The color filter photosensitive resin composition of claim 1, wherein the acryl-based photopolymerizable monomer comprises a blue dye functional group, and the photosensitive resin composition comprises:

about 1 to about 70 wt % of the acryl-based binder resin having at least one carboxyl group (A);

about 3 to about 30 wt % of the acryl-based photopolymerizable monomer (B) including the blue dye functional group;

about 0.1 to about 5 wt % of the photopolymerization initiator (C); and balance of the solvent (D).

9. The color filter photosensitive resin composition of claim 8, wherein the acryl-based binder resin comprises a copolymer of
i) a first ethylenic unsaturated monomer including at least one carboxyl group, and
ii) a second ethylenic unsaturated monomer copolymerizable with the first ethylenic unsaturated monomer.

10. The color filter photosensitive resin composition of claim 1, wherein the photopolymerization initiator comprises a triazine-based compound, an acetophenone-based compound, a benzophenone-based compound, a thioxanthone-based compound, a benzoin-based compound, an oxime-based compound, or a combination thereof.

11. The color filter photosensitive resin composition of claim 1, wherein the photosensitive resin composition further comprises at least one additive comprising malonic acid, 3-amino-1,2-propanediol, a silane coupling agent, a leveling agent, a fluorine-based surfactant, a silicone-based surfactant, or a combination thereof 12. A color filter comprising a pattern prepared using the photosensitive resin composition according to claim 1.

* * * * *